(12) United States Patent
Masaki

(10) Patent No.: US 6,970,116 B2
(45) Date of Patent: Nov. 29, 2005

(54) MULTIPLEXER CIRCUIT FOR CONVERTING PARALLEL DATA INTO SERIAL DATA AT HIGH SPEED AND SYNCHRONIZING THE SERIAL DATA WITH A CLOCK SIGNAL

(75) Inventor: Shunichiro Masaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/705,977

(22) Filed: Nov. 13, 2003

(65) Prior Publication Data
US 2004/0100947 A1 May 27, 2004

(30) Foreign Application Priority Data
Nov. 22, 2002 (JP) .............................. 2002-339307

(51) Int. Cl.[7] .......................... H03M 9/00; G06F 13/12; G06F 13/38; H04L 12/50; H04Q 11/00
(52) U.S. Cl. .......................... 341/101; 710/71; 370/366
(58) Field of Search ............................... 341/100, 101; 326/93; 345/98; 377/68, 67; 710/71; 365/145, 365/203; 370/366, 537, 367, 368, 532

(56) References Cited

U.S. PATENT DOCUMENTS

| | | | | |
|---|---|---|---|---|
| 2,877,357 A | * | 3/1959 | Pearsall, Jr. et al. | 377/68 |
| 3,090,034 A | * | 5/1963 | Fredericks et al. | 341/101 |
| 4,578,781 A | * | 3/1986 | Ogawa et al. | 365/203 |
| 5,543,791 A | * | 8/1996 | Riggio, Jr. | 341/101 |
| 5,959,559 A | * | 9/1999 | Weder | 341/101 |
| 5,959,601 A | * | 9/1999 | Ho et al. | 345/98 |
| 5,982,309 A | * | 11/1999 | Xi et al. | 341/101 |
| 5,990,813 A | * | 11/1999 | Ten Eyck | 341/100 |
| 6,064,713 A | * | 5/2000 | Lebrun et al. | 377/67 |
| 6,175,885 B1 | * | 1/2001 | Marbot et al. | 710/71 |
| 6,845,032 B2 | * | 1/2005 | Toyoda et al. | 365/145 |
| 6,856,171 B1 | * | 2/2005 | Zhang | 326/93 |
| 2003/0076821 A1 | | 4/2003 | Takauchi et al. | |

FOREIGN PATENT DOCUMENTS

JP    2003-133931    5/2003

OTHER PUBLICATIONS

W. Dally, et al., "Digital Systems Engineering," Cambridge, 1998 (Figures 11-22 and 11-25).

* cited by examiner

Primary Examiner—Patrick Wamsley
(74) Attorney, Agent, or Firm—Arent Fox, PLLC.

(57) ABSTRACT

A multiplexer circuit converts parallel data into serial data synchronized with an internal clock signal, and the multiplexer circuit has a logic circuit, a load circuit, and a plurality of switching elements. The logic circuit processes the internal clock signal and the parallel data. The load circuit and the plurality of switching elements are connected in series between a first power source line and a second power source line. Each of the switching elements is controlled in accordance with an output of the logic circuit.

16 Claims, 12 Drawing Sheets

Fig.10
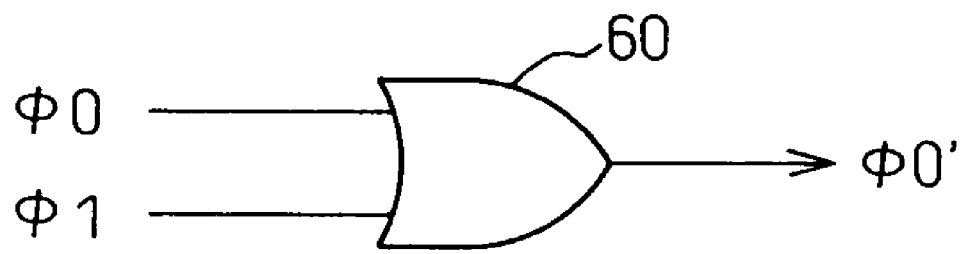
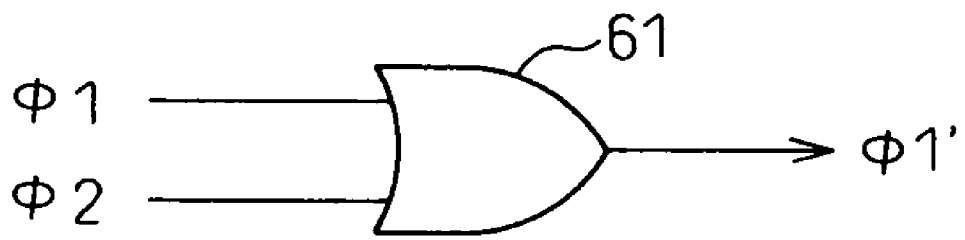
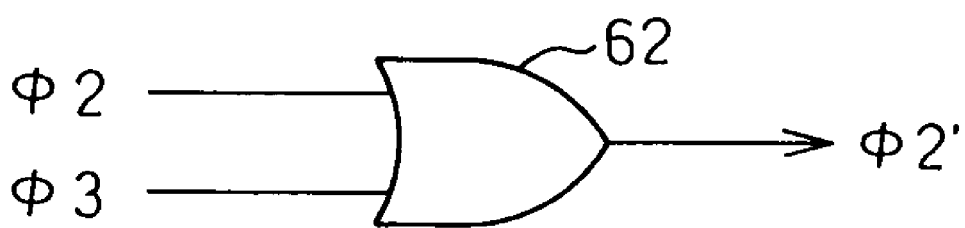
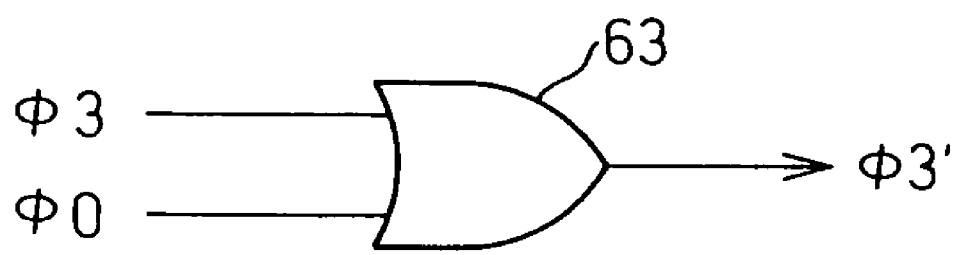

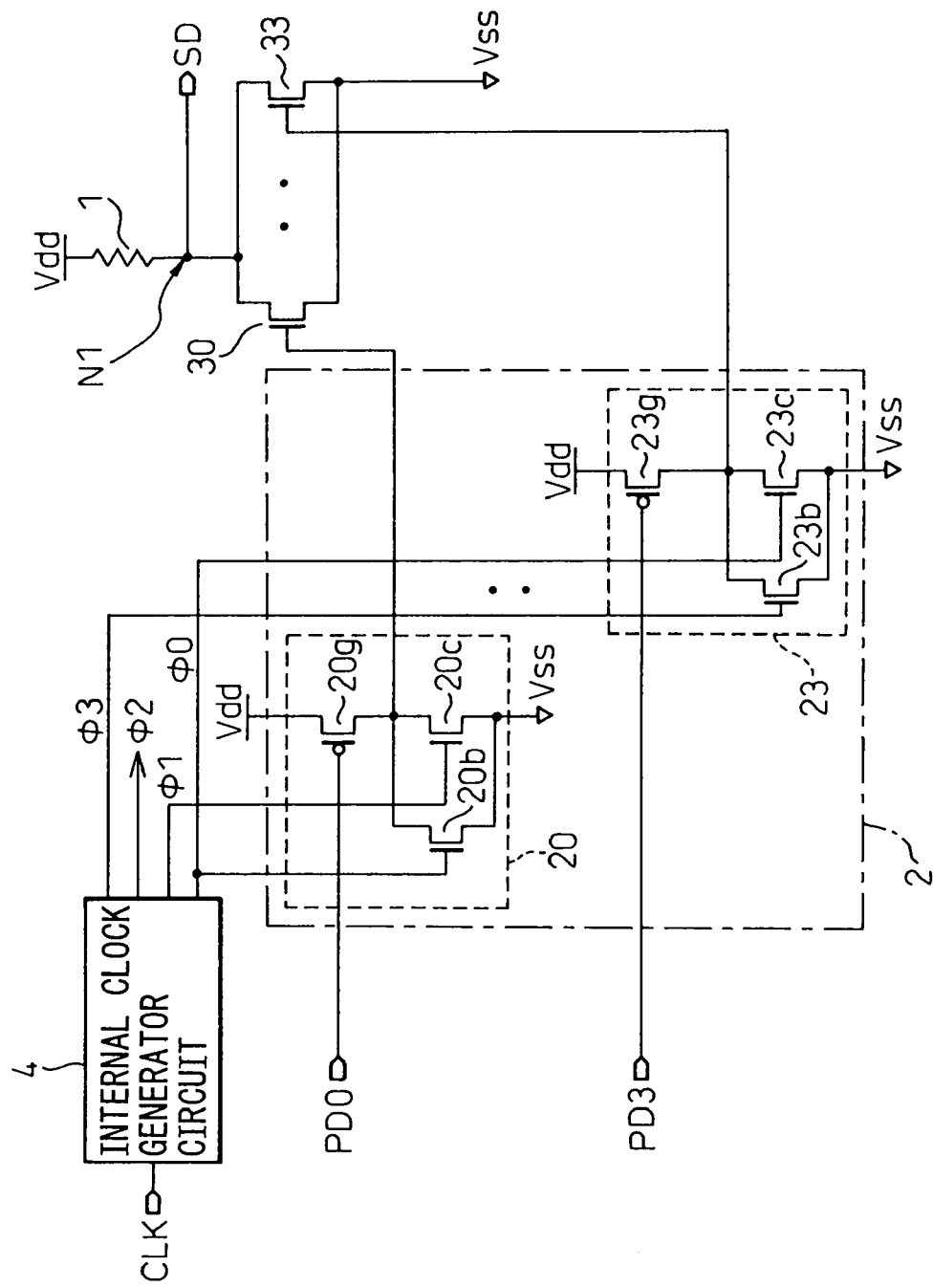

MULTIPLEXER CIRCUIT FOR CONVERTING PARALLEL DATA INTO SERIAL DATA AT HIGH SPEED AND SYNCHRONIZING THE SERIAL DATA WITH A CLOCK SIGNAL

CROSS REFERENCE TO RELATED APPLICATION

This application is based upon and claims the benefit of priority from the prior Japanese Patent Application No. 2002-339307, filed on Nov. 22, 2002, the entire contents of which are incorporated herein by reference.

BACKGROUND OF THE INVENTION

1. Field of the Invention

The present invention relates to a technique for carrying out high-speed transmission of signals between LSIs or between devices formed by a plurality of LSIs. More particularly, the present invention relates to a multiplexer circuit that converts parallel data into serial data.

2. Description of the Related Art

Recently, the performance of components used in computers and other information processing apparatuses has been greatly improved. In particular, dramatic improvements have been made, for example, in the performance of processors and semiconductor memory devices such as SRAMs (Static Random Access Memories) and DRAMs (Dynamic Random Access Memories). The improvements in the performance of semiconductor memory devices, processors, and the like have come to the point where system performance cannot be improved further unless the speed of signal transmission between components or elements is increased.

Further, in recent years, along with the increase in the operation speed of LSIs, it has become necessary to provide a signal transmission system that can perform high-speed transmission of large-capacity signals between LSIs or between devices constructed of a plurality of LSIs. For example, in network infrastructures, high-speed transmission in the order of gigabits per second (Gbps) is required. As a result, a focus has been placed on a device called a "giga-bit SerDes (serializer and deserializer)".

In the interface circuit that has the SerDes function, it is necessary to convert relatively low-speed parallel data received from a logic circuit that carries out a data processing like a network switching, into high-speed serial data at Gbps speed, and output the converted data, for example. As the data speed has become so fast, it has become necessary to improve time constants by preparing a separate current path, at a portion that has an upper limit in the operation frequency within the LSI circuit. Alternatively, it has become necessary to reduce a power source inductance portion, by using differential signals, in the data processing inside the LSI.

Conventionally, a multiplexer circuit that converts parallel data into serial data carries out data processing by using multi-phase clock signals, as described in "DIGITAL SYSTEMS ENGINEERING", Cambridge, 1998, by W, Dally et al. (for example, FIGS. 11–22 and FIGS. 11–25). In the conventional multiplexer circuits, it has been difficult to realize high-speed operation.

The prior art and its associated problems will be described in detail later with reference to relevant drawings.

SUMMARY OF THE INVENTION

An object of the present invention is to provide a multiplexer circuit that can convert parallel data into serial data at high speed and synchronize the serial data with clock signals.

According to the present invention, there is provided a multiplexer circuit converting parallel data into serial data synchronized with an internal clock signal, comprising a logic circuit processing the internal clock signal and the parallel data; and a load circuit and a plurality of switching elements connected in series between a first power source line and a second power source line, wherein each of the switching elements is controlled in accordance with an output of the logic circuit.

The serial data may be output from a connection node of the load circuit and the plurality of switching elements. The logic circuit may comprise a plurality of logic cells provided for respective data signal lines of the parallel data.

Each of the logic cells may comprise an inverter or a buffer amplifying the parallel data and controlling each of the switching elements; and a first conductivity type control transistor connected between the inverter or the buffer and the second power source line. The load circuit may be a plurality of second conductivity type switching transistors, wherein each of the logic cells may further comprise an inverter or buffer amplifying the parallel data and controlling each of the second conductivity type switching transistors; and a second conductivity type control transistor connected between the inverter or buffer and the first power source line.

Each of the logic cells may comprise a second conductivity type transistor directly receiving the parallel data; and a first conductivity type control transistor connected between a signal line where the internal clock signal is supplied and controlling each of the switching elements and the second power source line. The multiplexer circuit may output differential serial data.

The logic circuit may comprise a plurality of negative logic circuit elements provided for respective data signal lines of the parallel data; and a plurality of positive logic circuit elements. Each of the negative logic circuit elements may comprise an odd number of inverters amplifying the parallel data, outputting negative logic data, and controlling the switching elements for the negative logic; and a first conductivity type control transistor connected between output terminals of the inverters and the second power source line, and wherein the each of the positive logic circuit elements may comprise an even number of inverters amplifying the parallel data, outputting positive logic data, and controlling the switching elements for the positive logic; and a first conductivity type control transistor connected between output terminals of the inverters and the second power source line. The switching elements for the positive logic and the switching elements for the negative logic may be connected to the second power source line through a common current source.

The internal clock signal may be multi-phase clock signals, and the first conductivity type control transistor may be controlled by the multi-phase clock signals. The multi-phase clock signals may be four-phase clock signals having duty ratio of 50%, and the first conductivity type control transistor controlled by the multi-phase clock signals may be two MIS transistors controlled by two adjacent clock signals of the four-phase clock signals. The multi-phase clock signals may be four-phase clock signals having duty ratio of 75%, and the first conductivity type control transistor controlled by the multi-phase clock signals may be one MIS transistor controlled by one clock signal of the four-phase clock signals. The multiplexer circuit may further comprise a clock generation circuit generating the multi-phase clock signals from an external clock signal.

The first conductivity type transistor may be an n-channel type MIS transistor, and the second conductivity type transistor may be a p-channel type MIS transistor. The plurality of switching elements may constitute a plurality of first switching elements; the load circuit may constitute a plurality of second switching elements; and the serial data may be output from a connection node of the plurality of first switching elements connected in series between the first power source line and the second power source line and the plurality of second switching elements.

BRIEF DESCRIPTION OF THE DRAWINGS

The present invention will be more clearly understood from the description of the preferred embodiments as set forth below with reference to the accompanying drawings, wherein:

FIG. 10 is a diagram showing an example of a clock processing circuit in the multiplexer circuit shown in FIG. 9;

FIG. 12 is a block circuit diagram showing a sixth embodiment of the multiplexer circuit according to the present invention.

BRIEF DESCRIPTION OF THE PREFERRED EMBODIMENTS

Before describing the embodiments of the present invention in detail, a conventional multiplexer circuit and its problems will be explained with reference to FIGS. 1 and 2.

Figure 1:
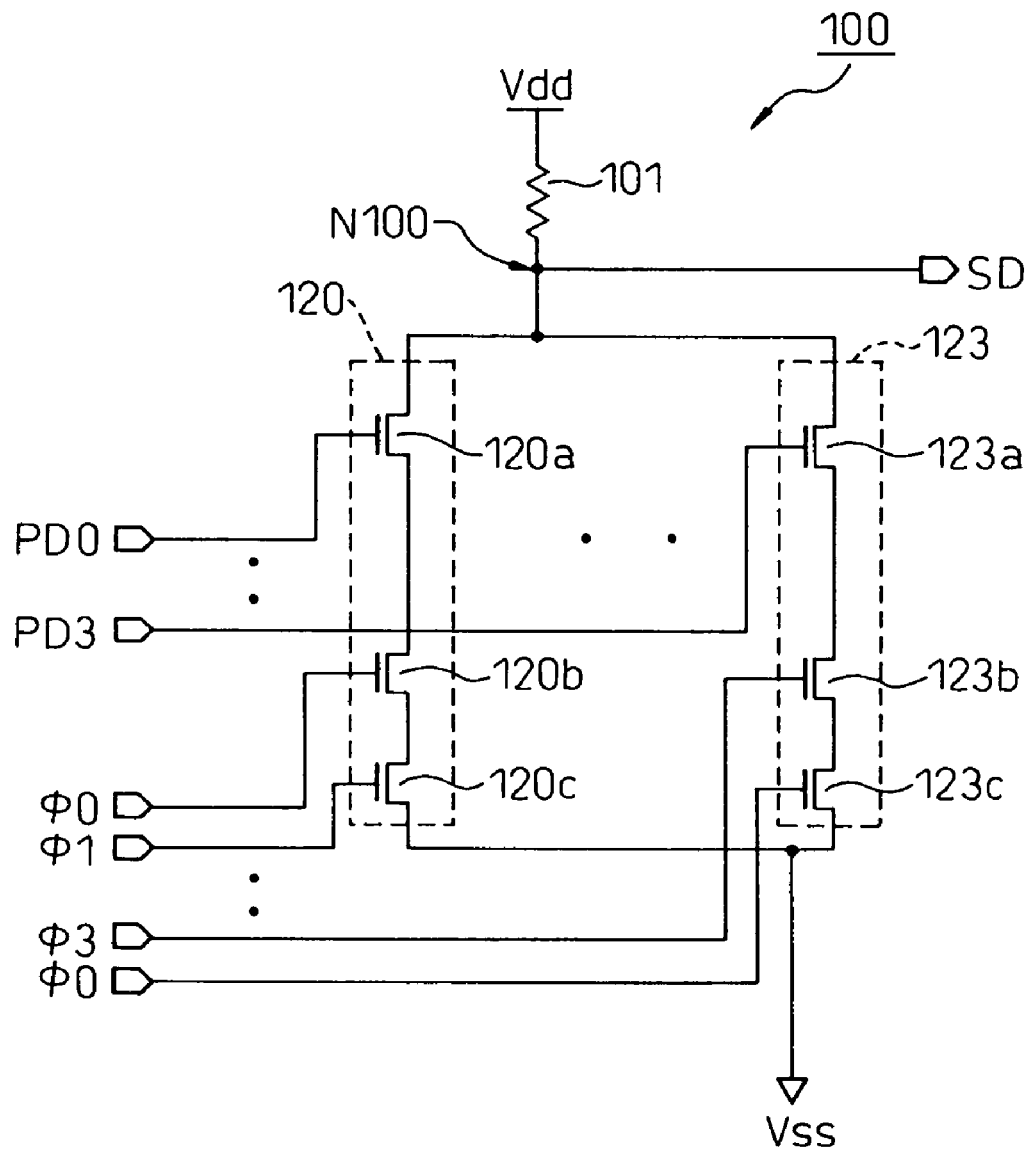
FIG. 1 is a circuit diagram showing an example of a multiplexer circuit according to the prior art.
Figure 2:
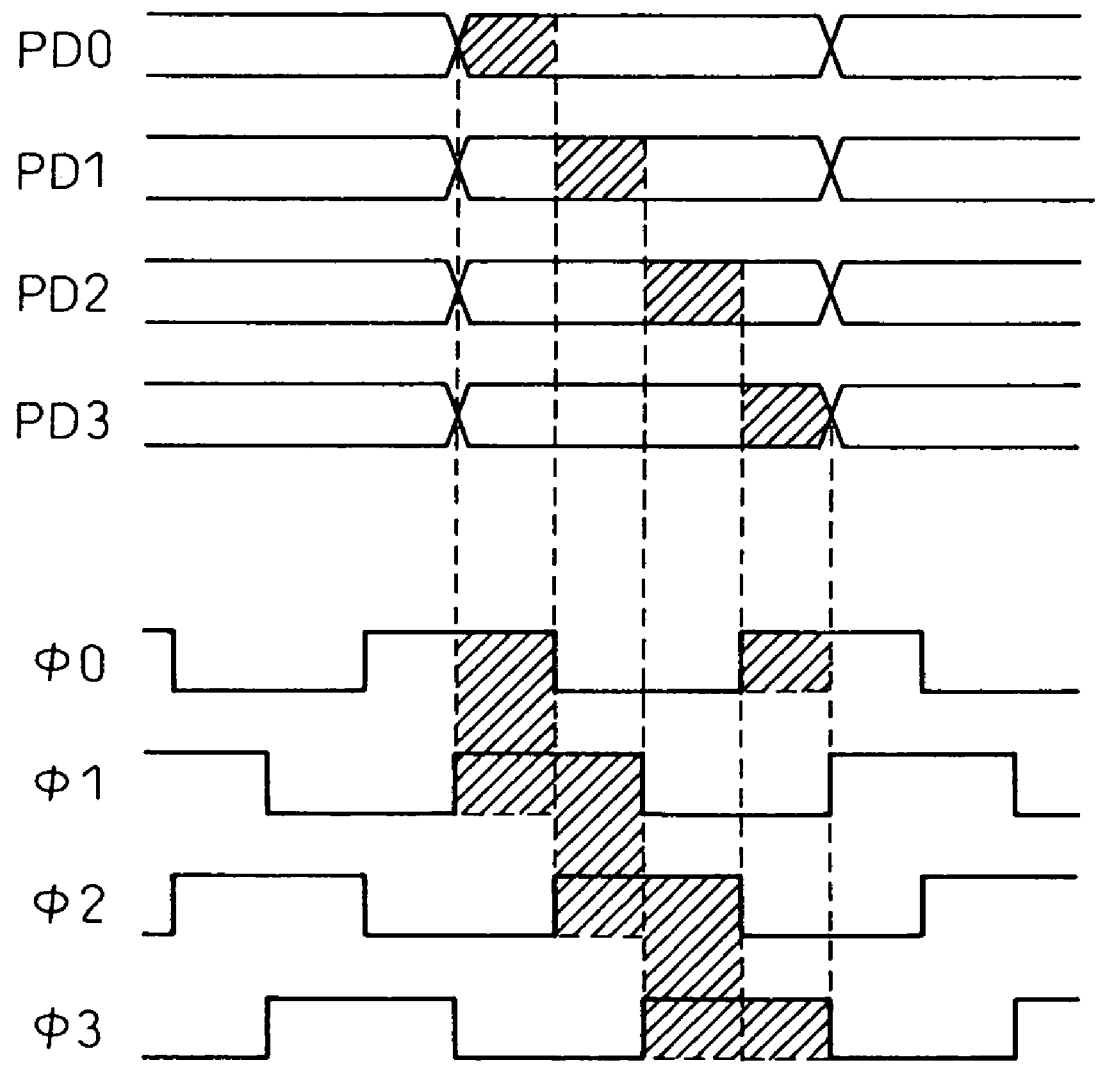
FIG. 2 is a timing chart for explaining the operation of the multiplexer circuit shown in FIG. 1.

FIG. 1 is a circuit diagram showing an example of a multiplexer circuit according to the prior art, and FIG. 2 is a timing chart for explaining the operation of the multiplexer circuit shown in FIG. 1. In FIGS. 1 and 2, references PD0 to PD3 denote parallel data, SD denotes serial data (output terminal), and $\phi 0$ to $\phi 3$ denote four-phase clock signals (internal clock signals) that have their phases mutually separated by 90 degrees respectively.

As shown in FIG. 1, the multiplexer circuit of the prior art comprises a load circuit 101 provided between a high-potential power source line Vdd and the output terminal (SD), and a plurality of (for example, four) multiplexer cells 120 to 123 connected in parallel each other and provided between the output terminal (SD) and a low-potential power source line Vss. Each multiplexer cell 120 (the same as 121 to 123) comprises three n-channel type MOS (Metal Oxide Semiconductor) transistors (nMOS transistors: more broadly, n-channel type MIS (Metal Insulator Semiconductor) transistors) 120a to 120c. Here, a gate of the transistor 120a is supplied with parallel data PD0, a gate of the transistor 120b is supplied with an internal clock signal $\phi 0$, and a gate of the transistor 120c is supplied with an internal clock signal $\phi 1$. Similarly, a gate of the transistor 121a is supplied with parallel data PD1, a gate of the transistor 121b is supplied with an internal clock signal $\phi 1$, and a gate of the transistor 121c is supplied with an internal clock signal $\phi 2$. Further, a gate of the transistor 123a is supplied with parallel data PD3, a gate of the transistor 123b is supplied with an internal clock signal $\phi 3$, and a gate of the transistor 123c is supplied with an internal clock signal $\phi 0$.

Specifically, as shown in FIG. 2, in the multiplexer cell 120 of the multiplexer circuit 100 shown in FIG. 1, when the internal clock signals $\phi 0$ and $\phi 1$ are both at high level "H", the transistors 120b and 120c are switched ON, so that the parallel data PD0 supplied to the gate of the transistor 120a is fetched. Here, the processes carried out in the multiplexer cell 120 are similarly carried out in each of the multiplexer cells 121 to 123, and thereby the parallel data PD0 to PD3 are converted into serial data SD and the converted serial data SD is output from a node N100.

Here, the load circuit 101 is, for example, constituted by a p-channel type MOS transistor (pMOS transistor: more broadly, p-channel type MIS transistor) whose gate receives the low-potential power source voltage (Vss). In the present specification, so as to simplify the explanation, it is mainly explained that four parallel data PD0 to PD3 are converted into serial data SD by using four-phase clock signals $\phi 0$ to $\phi 3$. Nevertheless, it is of course possible that the above features can be variously modified. Further, in FIG. 2, the parallel data PD0 to PD3 are changed at the same timing, however, the timings of the parallel data are preferably controlled at various timings in accordance with the timings of control signals for controlling respective transistors (for example, transistors 120b and 120c controlled by the internal clock signals $\phi 0$ and $\phi 1$ in the multiplexer cell 120).

In the prior art multiplexer circuit 100 explained with reference to FIGS. 1 and 2, each multiplexer cell 120 (121 to 123) is constituted by transistors 120a to 120c connected in series, and thereby the consumption of power (direct current power consumption) can be reduced.

However, when processing high-speed data at a speed higher than 1 Gbps, and further when applying a low drive voltage and a small signal amplitude to a multiplexer circuit, it becomes difficult by a high-speed operation requirement to use a multiplexer cell shown in FIG. 1 where a transistor (120a) controlled by a parallel data (PD0) and transistors (120b, 120c) controlled by internal clock signals ($\phi 0$, $\phi 1$) are connected in series.

Specifically, in the aforementioned multiplexer circuit 100 of the prior art, the transistors 120a to 120c (and transistor 101) are connected between the high-potential power source line Vdd and the low-potential power source line Vss, and thereby a band margin is not sufficient to carry out a high-speed operation.

The reason why the prior multiplexer circuit cannot realize a high-speed operation is that an ON-resistance of a transistor should be small (gate width of the transistor should be enlarged) so as to drive all transistors within a saturation area, but the ON-resistance of the transistor cannot be sufficiently small, in practice, as the occupied area becomes large when the gate width of the transistor is enlarged. Further, when the transistor size is enlarged, the occupied area is not only increased, but also a capacitance value of a parasitic capacitor of the gate becomes large and a high-speed operation cannot be realized. Further, another reason why the prior multiplexer circuit cannot realize a high-speed operation is that the band margin becomes insufficient by increasing the number of nodes to be charged up from an output side, as a plurality of transistors (101 and 120a to 120c) are connected in series.

Next, a basic configuration of a multiplexer circuit according to the present invention will be explained with reference to FIG. 3.

Figure 3:
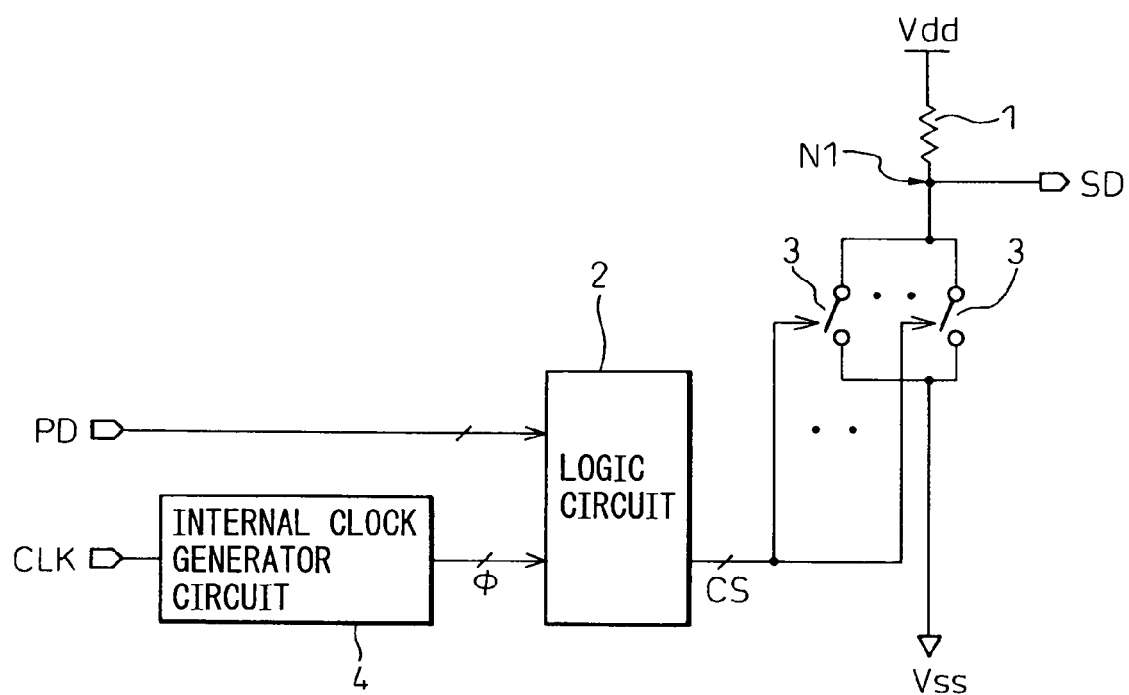
FIG. 3 is a circuit diagram showing the basic configuration of a multiplexer circuit according to the present invention.

FIG. 3 is a circuit diagram showing the basic configuration of a multiplexer circuit according to the present invention. In FIG. 3, a reference numeral 1 denotes load circuit, 2 denotes a logic circuit, 3 denotes a switching element, and 4 denotes an internal clock generator circuit.

The load circuit 1 is connected between a high-potential power source line Vdd and a low-potential power source line Vss in series with a plurality of switching elements 3 which are connected in parallel each other, and serial data SD is output from a connection node N1 between the plurality of switching elements 3 and the load circuit 1. The logic circuit 2 receives parallel data PD and an internal clock signal $\phi$, and outputs a control signal CS to control the plurality of switching elements 3. Here, the internal clock signal $\phi$ is generated from an external clock signal CLK by using the internal clock generator circuit 4. Nevertheless, when a clock signal (internal clock signal $\phi$) used for another circuit has already been generated, this clock signal can be also used as a clock signal for the multiplexer circuit.

As described above, in the multiplexer circuit shown in FIG. 3, the parallel data PD and the internal clock signal $\phi$ are logically processed, the switching elements 3 are controlled by the output signal (control signal CS) of the logic circuit 2, and the number of stages of the switching elements connected in series between the high-potential power source line Vdd and the low-potential power source line Vss are decreased, so that a high-speed operation can be realized.

Below, embodiments of a multiplexer circuit according to the present invention will be explained in detail with reference to the accompanying drawings.

Figure 4:
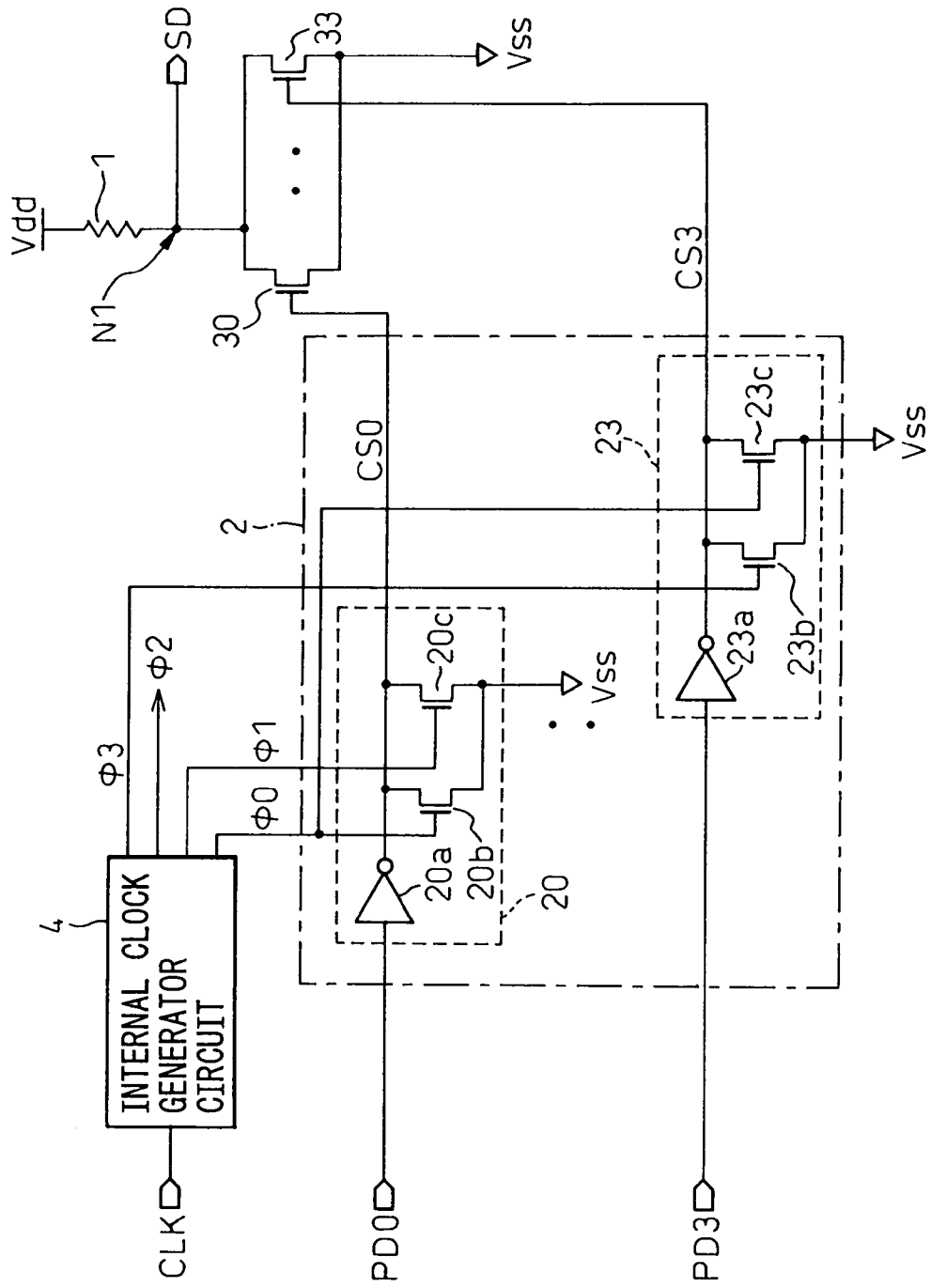
FIG. 4 is a block circuit diagram showing a first embodiment of the multiplexer circuit according to the present invention.
Figure 5:
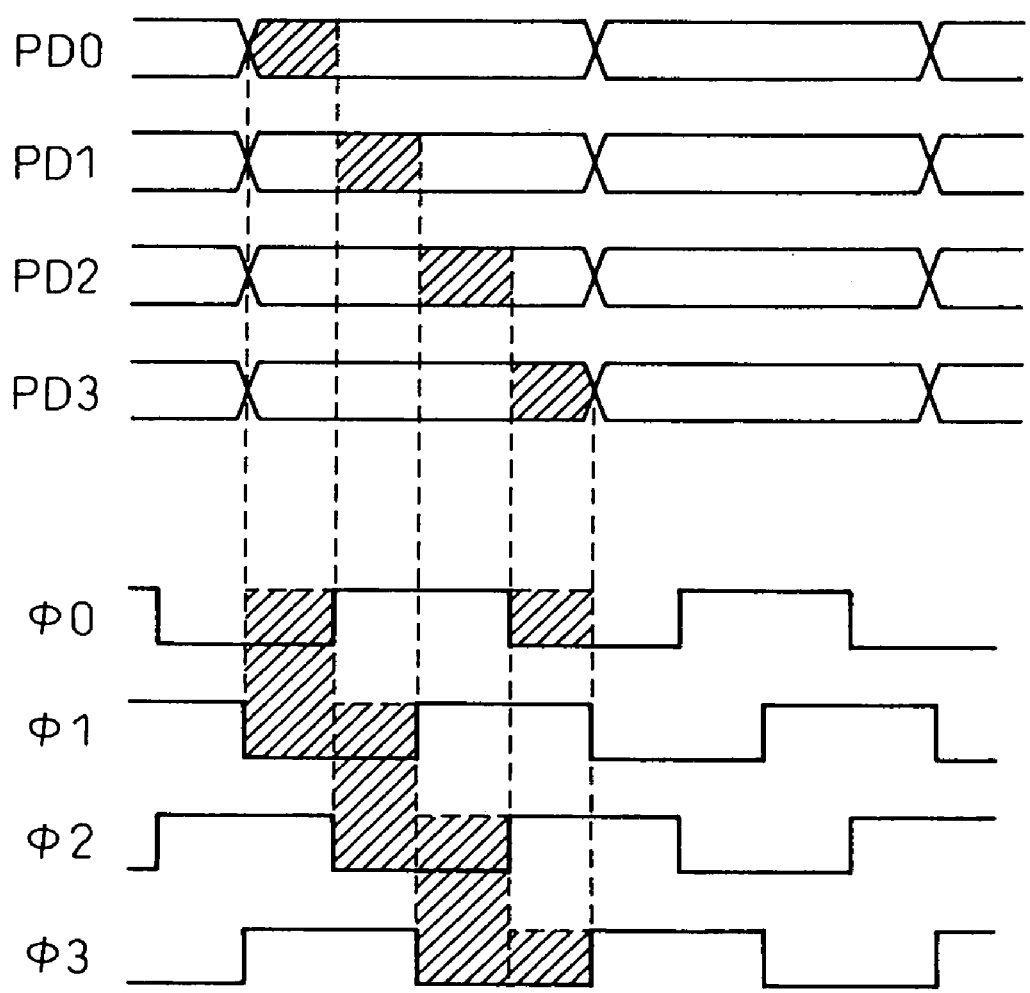
FIG. 5 is a timing chart for explaining the operation of the multiplexer circuit shown in FIG. 4.

FIG. 4 is a block circuit diagram showing a first embodiment of the multiplexer circuit according to the present invention, and FIG. 5 is a timing chart for explaining the operation of the multiplexer circuit shown in FIG. 4. In FIG. 4, references PD0 to PD3 denote parallel data, SD denotes serial data (output terminal), CS0 to CS3 denote control signals, and $\phi 0$ to $\phi 3$ denote four-phase clock signals (internal clock signals) that have their phases mutually separated by 90 degrees respectively. While the multiplexer circuit shown in FIG. 4 is an example of a multiplexer circuit of 4:1, it is needless to mention that the ratio is not limited to this in the present invention.

As shown in FIG. 4, the multiplexer circuit of the first embodiment comprises a load circuit 1 connected between the high-potential power source line Vdd and the output terminal (SD), and a plurality of (for example, four) switching elements (nMOS transistors) 30 to 33 connected in parallel each other. Output signals (control signals) of CS0 to CS3 are supplied to respective gates of the nMOS transistors (switching elements) 30 to 33, and serial data SD is output from a connection node N1 between the load circuit 1 and drains of the transistors 30 to 33 connected in parallel each other. Here, the logic circuit 2 receives the parallel data PD0 to PD3 and the internal clock signals $\phi 0$ to $\phi 3$ (clock signals having duty ratio of 50%), and outputs the control signals CS0 to CS3 by logically processing the parallel data and the internal clock signals.

The logic circuit 2 comprises a plurality of (for example, four) logic cells 20 to 23. The logic cell 20 comprises an inverter 20a to amplify and invert the parallel data PD0, and nMOS transistors (control transistors) 20b and 20c whose gates receive the internal clock signals $\phi 0$ and $\phi 1$, connected between an output node (where a control signal CS0 supplied to a gate of the switching element 30 is output) of the inverter 20a and the low-potential power source line Vss. Here, the other logic cells 21 to 23 have the same features as that of the logic cell 20. Specifically, the logic cell 21 comprises an inverter 21a to amplify and invert the parallel data PD1, and nMOS transistors 21b and 21c whose gates receive the internal clock signals $\phi 1$ and $\phi 2$, connected between an output node of the inverter 21a and the low-potential power source line Vss; and the logic cell 23 comprises an inverter 23a to amplify and invert the parallel data PD3, and nMOS transistors 23b and 23c whose gates receive the internal clock signals $\phi 3$ and $\phi 0$, connected between an output node of the inverter 23a and the low-potential power source line Vss. Here, the logic cells 20 to 23 control the corresponding switching elements 30 to 33 in accordance with the control signals CS0 to CS3, respectively. Further, each of the inverters 20a to 23a can be constituted as a buffer.

For example, in the logic cell 20, with reference to FIG. 5, when both internal clock signals $\phi 0$ and $\phi 1$ are at a low level "L", the transistors 20b and 20c are switched OFF, and an output signal (control signal CS0) of the inverter 20a is supplied to a gate of the switching element (nMOS transistor) 30 as it is. Specifically, when the output of the inverter 20a is at a high level "H", the transistor 30 is switched ON, and when the output of the inverter 20a is at a low level "L", the transistor 30 is switched OFF. On the other hand, in the cases except when both internal clock signals $\phi 0$ and $\phi 1$ are at a low level "L" (when at least one of the internal clock signals $\phi 0$ and $\phi 1$ is at a high level "H"), at least one of the transistors 20b and 20c is switched ON, and a gate level (control signal CS0) of the transistor 30 is pulled down to the low-potential power source line Vss regardless the output level of the inverter 20a, and thereby the transistor 30 is switched OFF.

The parallel data PD0 to PD3 are converted into serial data SD by using the logic cell 20 controlled by the internal clock signals $\phi 0$ and $\phi 1$, the logic cell 21 controlled by the internal clock signals $\phi 1$ and $\phi 2$, the logic cell 22 controlled by the internal clock signals $\phi 2$ and $\phi 3$, and the logic cell 23 controlled by the internal clock signals $\phi 3$ and $\phi 0$. The converted serial data SD is output from the connection node N1 between the load circuit 1 and the drains of the switching elements (transistors) 30 to 33.

Here, it is of course possible that the switching elements 30 to 33 can be constituted by pMOS transistors instead of nMOS transistors. Further, the load circuit 1 can be formed by using well-known features such as a pMOS transistor whose gate receives the low-potential power supply voltage (Vss). In addition, as described above, the parallel data and the internal clock signals are not limited to four parallel data and four-phase clock signals that have their phases mutually separated by 90 degrees respectively, but also the parallel data and the internal clock signals can be variously modified. The internal clock signals φ0 to φ3 are not limited the signals generated from the external clock signal CLK by using the internal clock generator circuit 4, when four-phase clock signals are provided for another circuit outside of the multiplexer circuit, those four-phase clock signals can be used for the internal clock signals as they are. Further, in FIG. 5, the parallel data PD0 to PD3 are changed at the same timing, however, the timings of the parallel data are preferably controlled at various timings in accordance with the timings of control signals for controlling respective transistors (for example, transistors 20b and 20c controlled by the internal clock signals φ0 and φ1 in the multiplexer cell 20). These matters can be also applied in the following embodiments.

Figure 6:
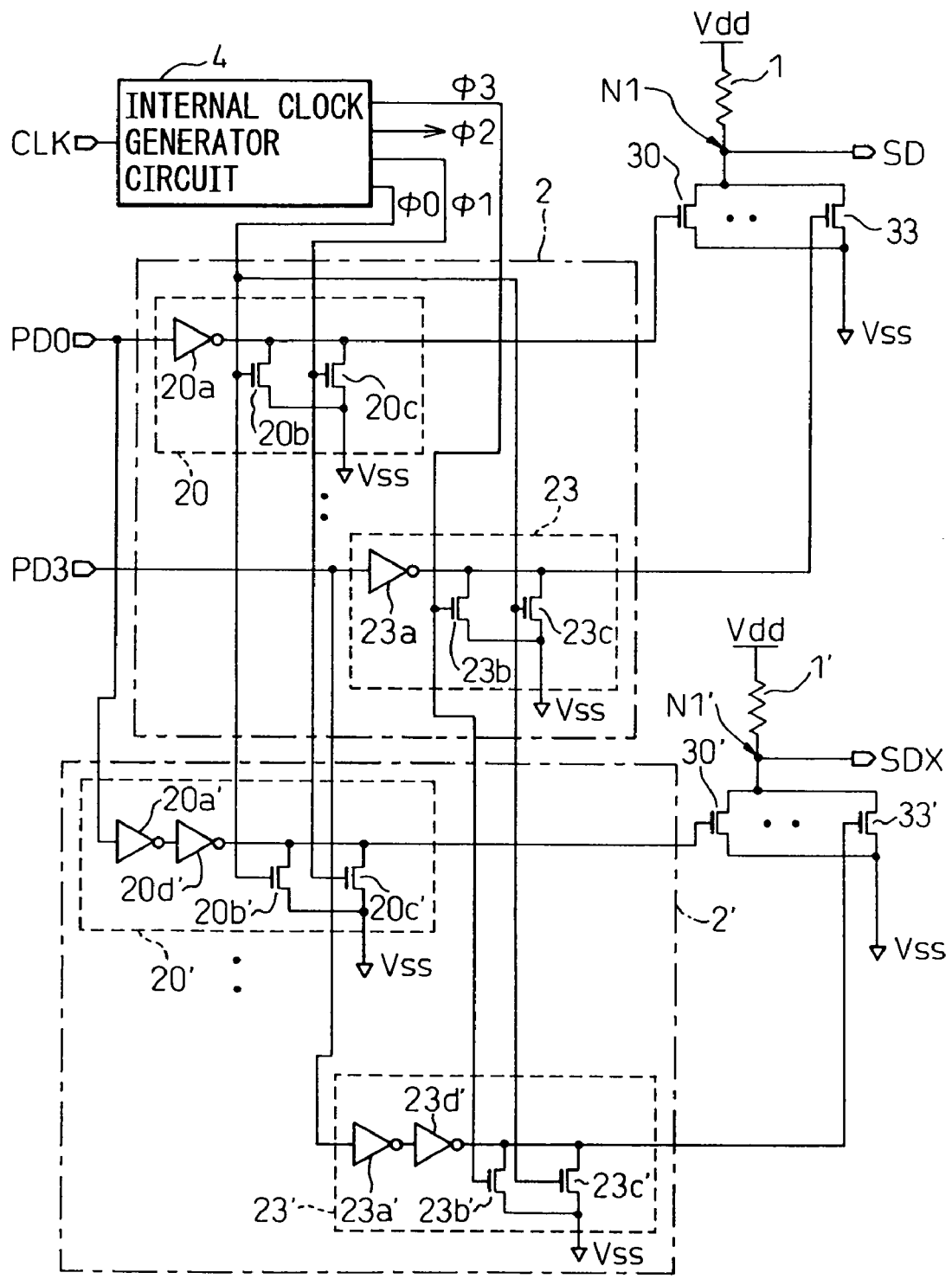
FIG. 6 is a block circuit diagram showing a second embodiment of the multiplexer circuit according to the present invention.

FIG. 6 is a circuit diagram that shows a first embodiment of a multiplexer cell in the multiplexer circuit relating to the present invention.

As clearly understood by comparing FIG. 6 with the aforementioned FIG. 4, the multiplexer circuit of the second embodiment comprises two sets of logic circuits 2, 2', load circuits 1, 1', and switching elements 30 to 33, 30' to 33' so as to obtain differential output signals (serial data SD, SDX). Here, each logic cell 20 (21 to 23) used for a positive logic output (SD) in the logic circuit 2 has the same features as that of the first embodiment shown in FIG. 4. Specifically, the logic cell 20 comprises one stage of an inverter 20a and nMOS transistors 20b, 20c. On the other hand, each logic cell 20' (21' to 23') used for a negative logic output (SDX) in the logic circuit 2 comprises two stages of inverters 20a', 20d', and nMOS transistors 20b', 20c'. Here, the load circuits 1, 1' and switching elements (nMOS transistors) 30 to 33, 30' to 33' have the same features, positive logic serial data SD is output from a connection node N1 between the load circuit 1 and drains of the transistors 30 to 33, and negative logic serial data SDX is output from a connection node N1' between the load circuit 1 and drains of the transistors 30' to 33'.

As described above, in accordance with the second embodiment of a multiplexer circuit according to the present invention, differential (complementary) serial data SD, SDX can be output and, therefore, when the next-stage circuit is constituted as to process differential signals, the differential serial data SD, SDX can be directly applied to the next-stage circuit.

Figure 7:
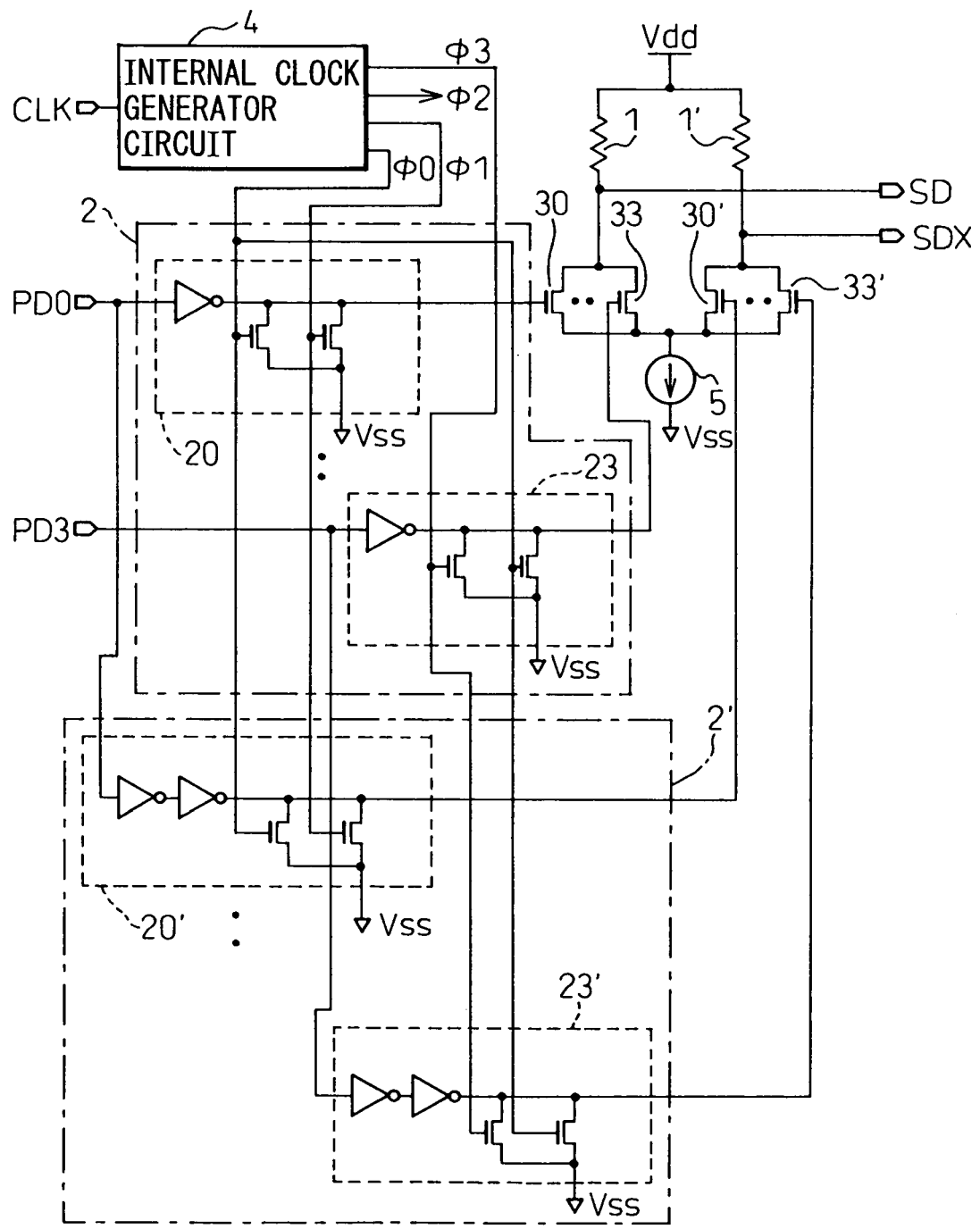
FIG. 7 is a block circuit diagram showing a third embodiment of the multiplexer circuit according to the present invention.

FIG. 7 is a block circuit diagram showing a third embodiment of the multiplexer circuit according to the present invention.

As clearly understood by comparing FIG. 7 with the aforementioned FIG. 6, the multiplexer circuit of the third embodiment further comprises a current source 4 in addition to the multiplexer circuit of the second embodiment, and switching elements 30 to 33 and 30' to 33' are connected to the low-potential power source line Vss through the current source 4. Specifically, sources of the nMOS transistors 30 to 33 and 30' to 33' are connected to the low-potential power source line Vss through the commonly provided current source 4.

In accordance with the third embodiment of the multiplexer circuit, the characteristics of the differential serial data (differential signals) SD, SDX can be preferable to those of the second embodiment.

Figure 8:
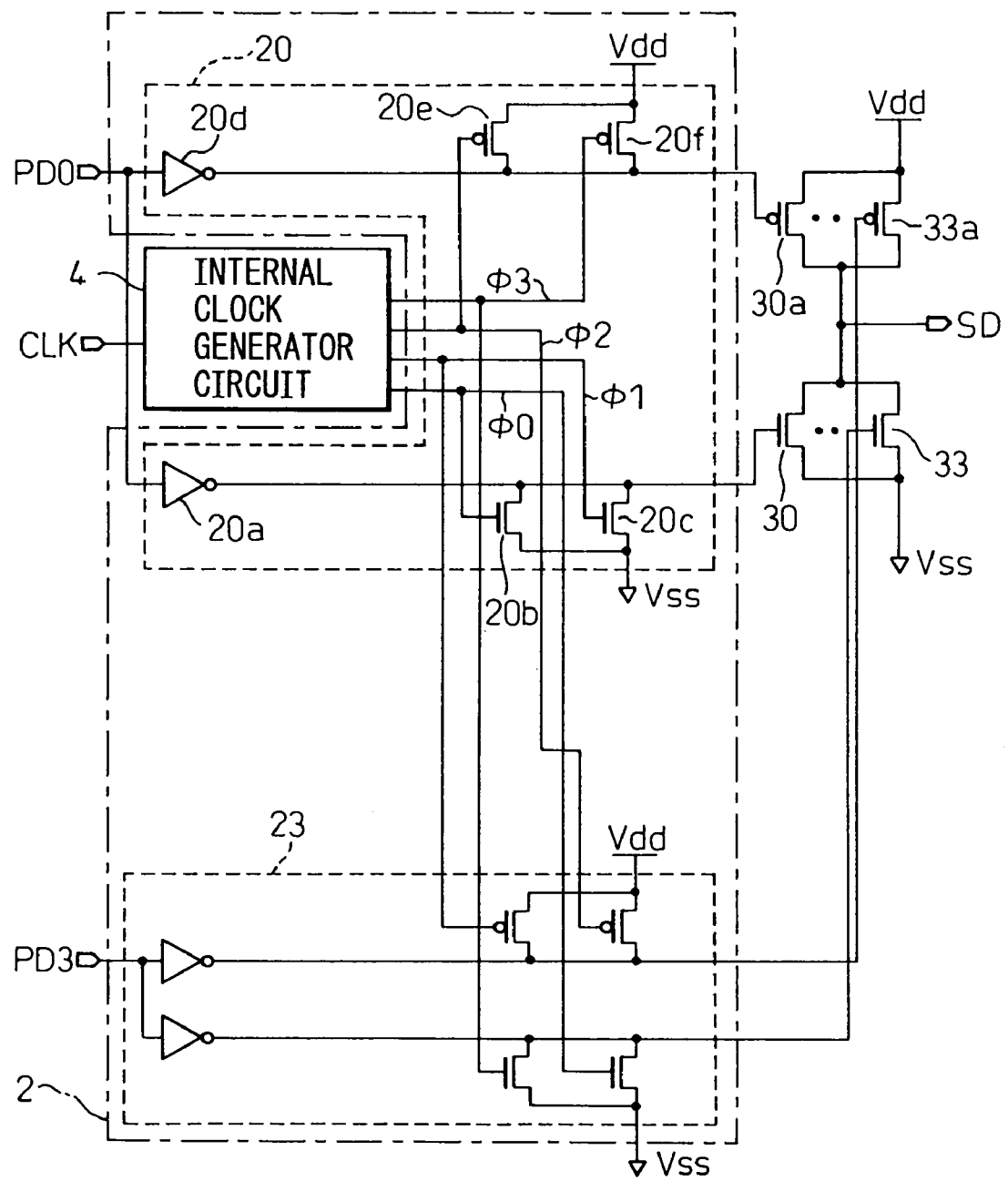
FIG. 8 is a block circuit diagram showing a fourth embodiment of the multiplexer circuit according to the present invention.

FIG. 8 is a block circuit diagram showing a fourth embodiment of the multiplexer circuit according to the present invention.

As clearly understood by comparing FIG. 8 with the aforementioned FIG. 4, the multiplexer circuit of the fourth embodiment corresponds to the multiplexer circuit of the first embodiment wherein each logic cell 20 (21 to 23) is constituted by inverters 20a, 20d, nMOS transistors 20b, 20c and pMOS transistors 20e, 20f, and wherein the load circuit 1 is constituted by a pMOS transistor 30a (31a to 33a) receiving an output signal of the inverter 20d.

Specifically, in the logic cell 20, the inverter 20d receives the parallel data PD0 and pMOS transistors 20e, 20f are provided in addition to the inverter 20a and nMOS transistors 20b, 20c of the first embodiment shown in FIG. 4. Here, clock signals, which are inverted from the internal clock signals φ0 and φ1 supplied to the gates of the nMOS transistors 20b and 20c, corresponding to the internal clock signals φ2 and φ3 are supplied to gates of the pMOS transistors 20e and 20f. Therefore, output signals of the inverters 20a and 20d are supplied to a gate of the switching element (nMOS transistor) 30 and a gate of the switching element 30a (pMOS transistor) 30a during the same period (during a period where both internal clock signals φ0 and φ1 are at a low level "L" or where both internal clock signals φ2 and φ3 are at a high level "H").

Here, in other cases (a period when at least one of the internal clock signals φ0 and φ1 is at a high level "H" or when at least one of the internal clock signals φ2 and φ3 is at a low level "H"), the switching elements 30 and 30a are both switched OFF. The parallel data PD0 to PD3 are converted to serial data SD by using the aforementioned logic cells 20 to 23 and switching elements 30 to 33 and 30a to 33a.

In accordance with the multiplexer circuit of the fourth embodiment, the serial data SD output from the multiplexer circuit can be sufficiently swung between the high-potential power supply voltage (Vdd) and the low-potential power supply voltage (Vss), and further, the direct current power consumption can be reduced.

Figure 9:
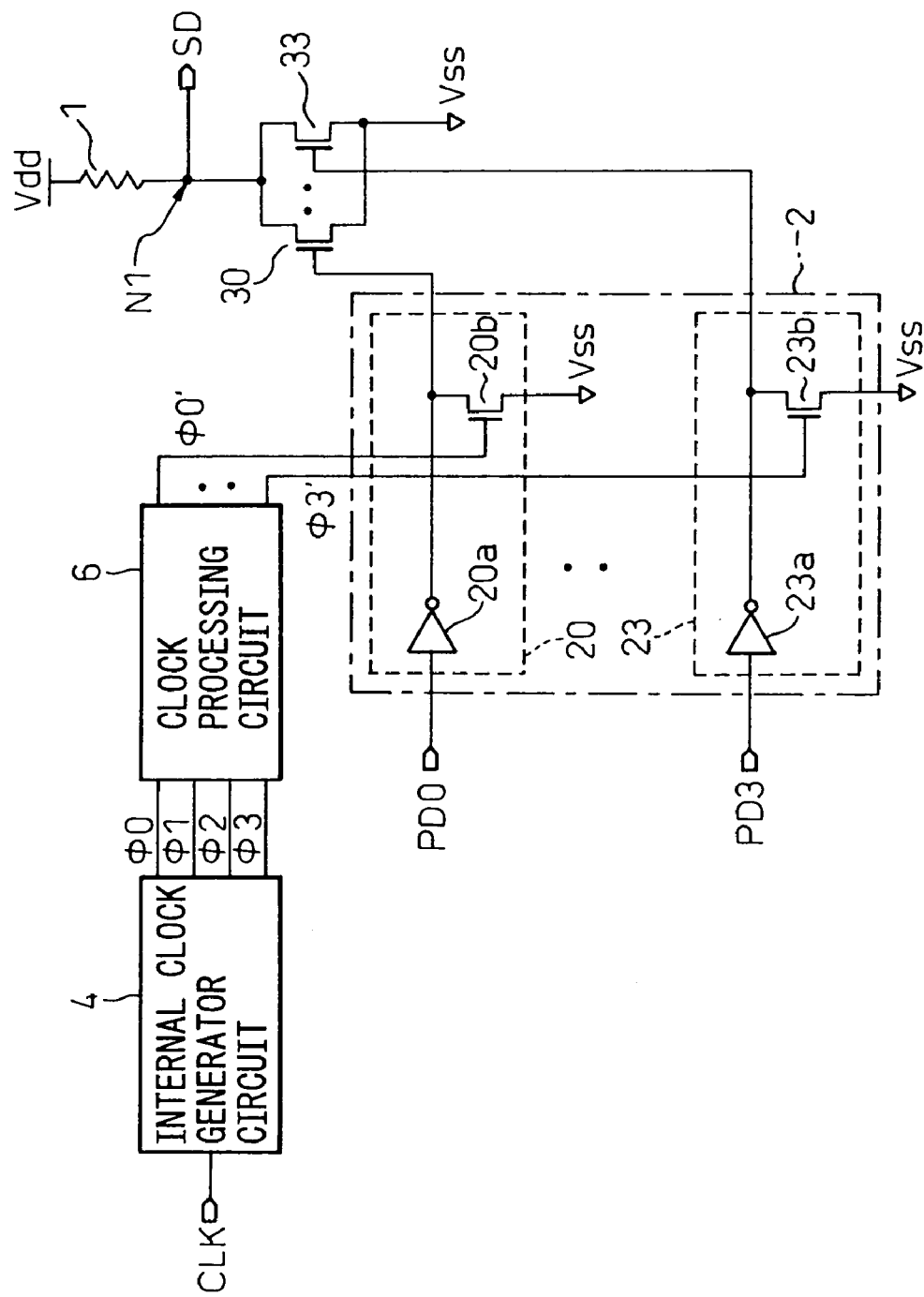
FIG. 9 is a block circuit diagram showing a fifth embodiment of the multiplexer circuit according to the present invention.

FIG. 9 is a block circuit diagram showing a fifth embodiment of the multiplexer circuit according to the present invention.

As can be clearly understood by comparing FIG. 9 with the aforementioned FIG. 4, in the multiplexer circuit of the fifth embodiment, each logic cell 20 (21 to 23) of the logic circuit 2 comprises an inverter 20a and an nMOS transistor 20b. Specifically, in the multiplexer circuit of the fifth embodiment according to the present invention, four-phase clock signals (internal clock signals) φ0 to φ3 output from the internal clock generator circuit 4 are processed in a clock processing circuit 6, and output signals (control clock signals: clock signals having duty ratio of 75%) φ0' to φ3' of the clock processing circuit 6 are supplied to gates of nMOS transistors 20b to 23b so as to omit the nMOS transistor 20c provided in the logic cell 20 of the multiplexer circuit according to the first embodiment shown in FIG. 4.

Figure 11:
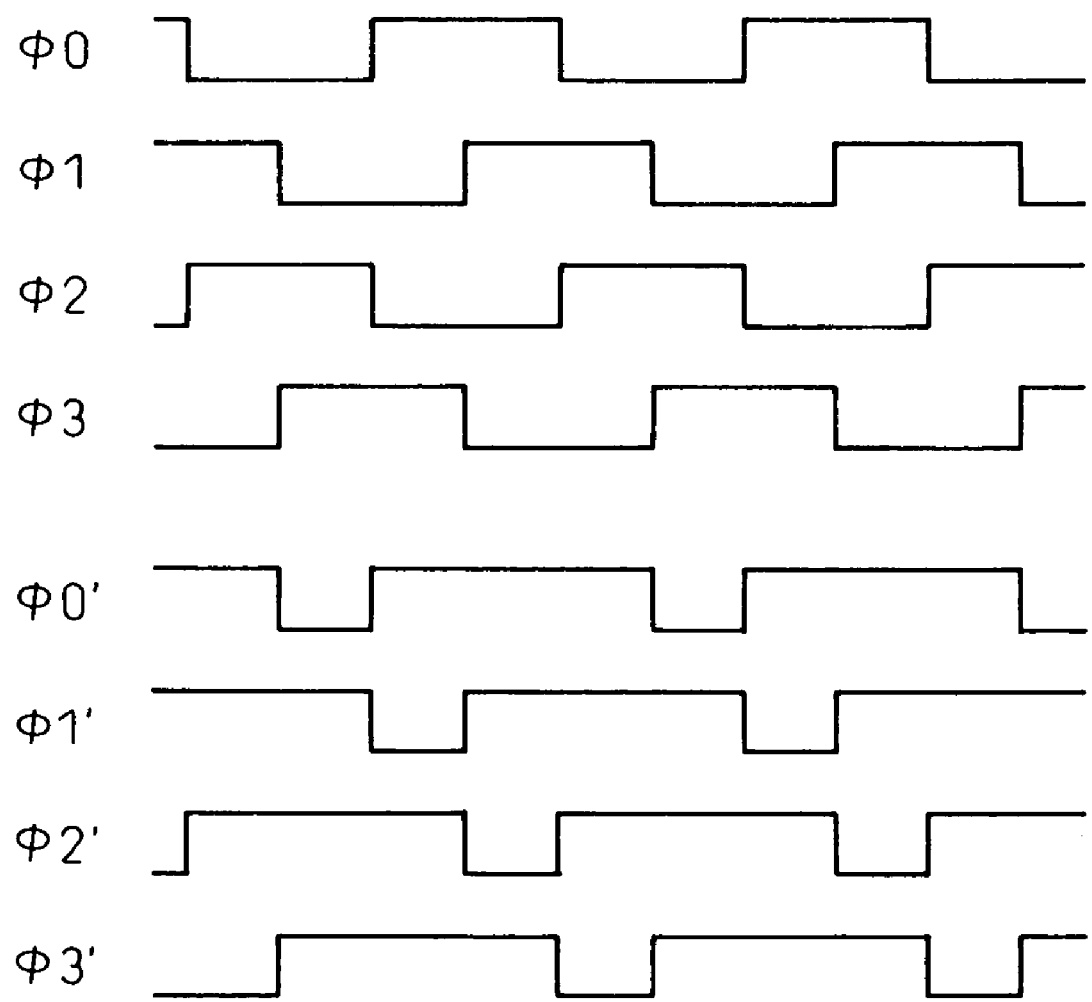
FIG. 11 is a timing chart for explaining the operation of the clock processing circuit shown in FIG. 10.

FIG. 10 is a diagram showing an example of a clock processing circuit in the multiplexer circuit shown in FIG. 9, and FIG. 11 is a timing chart for explaining the operation of the clock processing circuit shown in FIG. 10.

As shown in FIG. 10, the clock processing circuit 6 comprises four OR circuits 60 to 63 each receiving and processing logical-or two neighboring signals of the four-phase clock signals (internal clock signals) φ0 to φ3. Specifically, as shown in FIG. 11, the OR circuit 60 receives the internal clock signals φ0 and φ1, and outputs a control clock signal φ0' having duty ratio of 75% and being at a low level "L" only when both internal clock signals φ0 and φ1 are at a low level "L". The control clock signal φ0' output from the OR circuit 60 is supplied to a gate of the nMOS transistor 20b of the logic cell 20. Similarly, the OR circuit 61 (62; 63) receives the internal clock signals φ1, φ2 (φ2, φ3; φ3, φ0), and outputs a control clock signal φ1' (φ2'; φ3') which is at a low level "L" only when both internal clock signals φ1, φ2 (φ2, φ3; φ3, φ0) are at a low level "L". The control clock signal φ0' (φ2'; φ3') output from the OR circuit 61 (62; 63) is supplied to a gate of the nMOS transistor 21b (22b; 23b) of the logic cell 21 (22; 23).

As described above, the logic cells can realize the same functions as that of the first embodiment shown in FIG. 4 by supplying the clock signals having duty ratio of 75%, as shown in FIG. 11, to the gates of the nMOS transistors 20b to 23b provided in the logic cells 20 to 23.

In the multiplexer circuit of the fifth embodiment, the wiring for internal clock signals (control clock signals) can be reduced, as each of the logic cells 20 to 23 only requires one control clock signal φ0 to φ3.

FIG. 12 is a block circuit diagram showing a sixth embodiment of the multiplexer circuit according to the present invention.

As can be clearly understood by comparing FIG. 12 with the aforementioned FIG. 4, in the multiplexer circuit of the sixth embodiment, a pMOS transistor 20g, which is connected to the high-potential power source line Vdd, is provided instead of the inverter 20a in the logic cell 20 (21 to 23) of the multiplexer circuit, and the parallel data PD0 is directly supplied to a gate of the pMOS transistor 20g.

In accordance with the sixth embodiment of the present invention, input load value of the parallel data PD0 to PD3 can be reduced in comparison with the first embodiment wherein the parallel data PD0 to PD3 are input to the inverters 20a to 23a, and thereby a high-speed operation can be realized when a previous-stage circuit does not have a big driving capacity.

As explained above in detail, according to the present invention, it is possible to provide a multiplexer circuit that can convert parallel data into serial data at high speed and synchronize it with a clock signal.

Many different embodiments of the present invention may be constructed without departing from the spirit and scope of the present invention, and it should be understood that the present invention is not limited to the specific embodiments described in this specification, except as defined in the appended claims.

What is claimed is:

1. A multiplexer circuit converting parallel data into serial data synchronized with an internal clock signal, comprising:
   a logic circuit processing the internal clock signal and the parallel data; and
   a load circuit and a plurality of switching elements connected in series between a first power source line and a second power source line, wherein each of said switching elements consists of a MIS transistor and is controlled in accordance with an output of said logic circuit.

2. The multiplexer circuit as claimed in claim 1, wherein said logic circuit comprises a plurality of logic cells provided for respective data signal lines of the parallel data.

3. The multiplexer circuit as claimed in claim 2, wherein each of said logic cells comprises:
   an inverter or a buffer amplifying the parallel data and controlling each of said switching elements; and
   a first conductivity type control transistor connected between said inverter or said buffer and said second power source line.

4. The multiplexer circuit as claimed in claim 3, wherein the internal clock signal is a multi-phase clock signal, and said first conductivity type control transistor is controlled by the multi-phase clock signal.

5. The multiplexer circuit as claimed in claim 4, wherein the multi-phase clock signal is a four-phase clock signal having duty ratio of 50%, and said first conductivity type control transistor controlled by the multi-phase clock signal is two MIS transistors controlled by two adjacent clock signals of the four-phase clock signal.

6. The multiplexer circuit as claimed in claim 4, wherein the multi-phase clock signal is a four-phase clock signal having duty ratio of 75%, and said first conductivity type control transistor controlled by the multi-phase clock signal is one MIS transistor controlled by one phase of the four-phase clock signal.

7. The multiplexer circuit as claimed in claim 4, further comprising:
   a clock generation circuit generating the multi-phase clock signal from an external clock.

8. The multiplexer circuit as claimed in claim 3, wherein said load circuit is a plurality of second conductivity type switching transistors, wherein each of said logic cells further comprises:
   an inverter or buffer amplifying the parallel data and controlling each of said second conductivity type switching transistors; and
   a second conductivity type control transistor connected between said inverter or buffer and said first power source line.

9. The multiplexer circuit as claimed in claim 3, wherein said load circuit is a plurality of second conductivity type switching transistors, wherein each of said logic cells further comprises:
   an inverter or buffer amplifying the parallel data and controlling each of said second conductivity type switching transistors; and
   a second conductivity type control transistor connected between said inverter or buffer and said first power source line, wherein said first conductivity type control transistor is an n-channel type MIS transistor, and said second conductivity type control transistor is a p-channel type MIS transistor.

10. The multiplexer circuit as claimed in claim 2, wherein each of said logic cells comprises:
    a second conductivity type transistor directly receiving the parallel data; and
    a first conductivity type control transistor connected between a signal line where the internal clock signal is supplied and controlling each of said switching elements and said second power source line.

11. The multiplexer circuit as claimed in claim 1, wherein said multiplexer circuit outputs differential serial data.

12. The multiplexer circuit as claimed in claim 11, wherein said logic circuit comprises:
    a plurality of negative logic circuit elements provided for respective data signal lines of the parallel data; and a plurality of positive logic circuit elements.

13. The multiplexer circuit as claimed in claim 12, wherein each of said negative logic circuit elements comprises:
    an odd number of inverters amplifying the parallel data, outputting negative logic data, and controlling said switching elements for the negative logic; and a first conductivity type control transistor connected between output terminals of said inverters and said second power source line, and wherein said each of said positive logic circuit elements comprises:

an even number of inverters amplifying the parallel data, outputting positive logic data, and controlling said switching elements for the positive logic; and a first conductivity type control transistor connected between the output terminals of said inverters and said second power source line.

14. The multiplexer circuit as claimed in claim 13, wherein said switching elements for the positive logic and said switching elements for the negative logic are connected to said second power source line through a common current source.

15. The multiplexer circuit as claimed in claim 1, wherein the serial data is output from a connection node of said load circuit and said plurality of switching elements.

16. The multiplexer circuit as claimed in claim 1, wherein:

said plurality of switching elements constitute a plurality of first switching elements;

said load circuit constitutes a plurality of second switching elements; and the serial data is output from a connection node of said plurality of first switching elements connected in series between said first power source line and said second power source line and said plurality of second switching elements.

* * * * *